(12) United States Patent
Kishimura et al.

(10) Patent No.: US 6,537,736 B1
(45) Date of Patent: Mar. 25, 2003

(54) PATTEN FORMATION METHOD

(75) Inventors: Shinji Kishimura, Hyogo (JP); Akiko Katsuyama, Kyoto (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/523,201

(22) Filed: Mar. 10, 2000

(30) Foreign Application Priority Data

Mar. 12, 1999 (JP) .......................................... 11-066827

(51) Int. Cl.⁷ ........................... G03F 7/38; G03F 7/039; G03F 7/30
(52) U.S. Cl. .................... 430/330; 430/270.1; 430/325; 430/326; 430/905
(58) Field of Search .............................. 430/270.1, 325, 430/326, 330, 905

(56) References Cited

U.S. PATENT DOCUMENTS

| | | | | |
|---|---|---|---|---|
| 5,344,742 A | * | 9/1994 | Sinta et al. ............... | 430/270.1 |
| 5,545,509 A | * | 8/1996 | Cameron et al. ......... | 430/270.1 |
| 6,190,825 B1 | * | 2/2001 | Denzinger et al. ......... | 430/192 |
| 6,225,019 B1 | * | 5/2001 | Matsuda et al. ......... | 430/270.1 |

FOREIGN PATENT DOCUMENTS

| | | |
|---|---|---|
| JP | 58-052638 | 3/1983 |
| JP | 60-195542 | 10/1985 |
| JP | 61-003140 | 1/1986 |
| JP | 61-037824 | 2/1986 |
| JP | 63-129340 | 6/1988 |
| JP | 2-059751 | 2/1990 |
| JP | 4-251850 | 9/1992 |
| JP | 5-331289 | 12/1993 |
| JP | 6-083056 | 3/1994 |
| JP | 7-181679 | 7/1995 |
| JP | 7-181691 | 7/1995 |

* cited by examiner

Primary Examiner—John S. Chu
(74) Attorney, Agent, or Firm—Nixon Peabody LLP; Donald R. Studebaker (57) ABSTRACT

A resist film is formed by applying, on a semiconductor substrate, a resist material including a base polymer having a sulfonyl group on a main chain. The resist film is irradiated through a mask with exposing light of a wavelength of a 1 nm through 180 nm band for pattern exposure, and the resist film is developed after the pattern exposure, thereby forming a resist pattern.

7 Claims, 4 Drawing Sheets

PATTEN FORMATION METHOD

BACKGROUND OF THE INVENTION

The present invention relates to a pattern formation method, and more particularly, it relates to a method of forming a resist pattern, used for forming a semiconductor device or a semiconductor integrated circuit on a semiconductor substrate, by using exposing light of a wavelength of a 1 nm through 180 nm band.

Currently, in fabrication of a large capacity semiconductor integrated circuit, typically such as a 64 Mbit dynamic random access memory (DRAM), a logic device or a system LSI with a 0.25 μm through 0.18 μm rule, a resist pattern is formed by using a resist material including a polyhydroxystyrene derivative as a main component and exposing light of KrF excimer laser (with a wavelength of a 248 nm band).

Moreover, in a pattern formation method under development for a 256 Mbit DRAM, a 1 Gbit DRAM or a system LSI with a 0.15 μm through 0.13 μm rule, ArF excimer laser operated at a shorter wavelength (of a 193 nm band) than the KrF excimer laser is to be used as the exposing light.

A resist material including a polyhydroxystyrene derivative as a main component includes an aromatic ring having a high absorbing property against light of a wavelength of a 193 nm band. Therefore, the exposing light of a wavelength of a 193 nm band cannot uniformly reach the bottom of a resist film made from this resist material, and hence, a good pattern shape cannot be obtained with this exposing light. Accordingly, the resist material including a polyhydroxystyrene derivative as a main component cannot be used when the ArF excimer laser is used as the exposing light.

Therefore, when the ArF excimer laser is used as the exposing light, a material including, as a main component, a polyacrylic acid derivative free from an aromatic ring is used as a resist material.

On the other hand, X-rays and electron beams (EB) are now examined to be used as exposing light in a pattern formation method applicable to higher resolution.

When X-rays are used as the exposing light, however, there arise various problems in an aligner and formation of a mask. Also, when EB is used as the exposing light, there arises a problem of throughput, and hence, EB is not suitable to mass production. Thus, X-rays and EB are not preferred as the exposing light.

Accordingly, in order to form a resist pattern finer than 0.13 μm, it is necessary to use, as the exposing light, a laser beam with a wavelength shorter than that of the ArF excimer laser, such as a $Xe_2$ laser beam (with a wavelength of a 172 nm band), a $F_2$ laser beam (with a wavelength of a 157 nm band), a $Kr_2$ laser beam (with a wavelength of a 146 nm band), an ArKr laser beam (with a wavelength of a 134 nm band), an $Ar_2$ laser beam (with a wavelength of a 126 nm band) or a soft X-ray beam (with a wavelength of a 13, 11 or 5 nm band).

Therefore, the present inventors have formed a resist pattern from a resist film of a known resist material through pattern exposure using a $F_2$ laser beam.

However, the resultant resist pattern does not have a rectangular sectional shape but has a defective pattern shape.

SUMMARY OF THE INVENTION

In consideration of the aforementioned conventional problems, an object of the invention is forming a resist pattern in a good pattern shape by using light of a wavelength of a 1 nm through 180 nm band as exposing light.

The present inventors have earnestly examined the cause of the defective pattern shape of a resist pattern formed by using a conventionally known resist material, specifically, a resist material including a polyhydroxystyrene derivative or a polyacrylic acid derivative as a main component. As a result, it has been found that a carbonyl group included in the polyhydroxystyrene derivative or the polyacrylic acid derivative has a high absorbing property against light of a wavelength of a 1 nm through 180 nm band, so that the exposing light of a wavelength of a 1 nm through 180 nm band cannot sufficiently reach the bottom of the resist film. This seems the cause of the defective pattern shape of the resultant resist pattern.

Chemical Formula A below represents an example of the polyhydroxystyrene derivative used as a positive resist material in using KrF excimer laser, and Chemical Formula B below presents an example of the polyacrylic acid derivative used as a positive resist material in using ArF excimer laser.

General Formula A:

Chemical Formula B:

The present inventors have variously studied about means for decreasing the absorbing property against light of a wavelength of a 1 nm through 180 nm band. As a result, it has been found that the absorbing property of a resist film against light of a wavelength of a 1 nm through 180 nm band can be decreased when the resist material includes a sulfonyl group ($—SO_2—$).

This is because a sulfonyl group has a lower absorbing property against light of a wavelength of a 1 nm through 180 nm band than a carbonyl group included in the polyhydroxystyrene derivative or the polyacrylic acid derivative.

Figure 1:
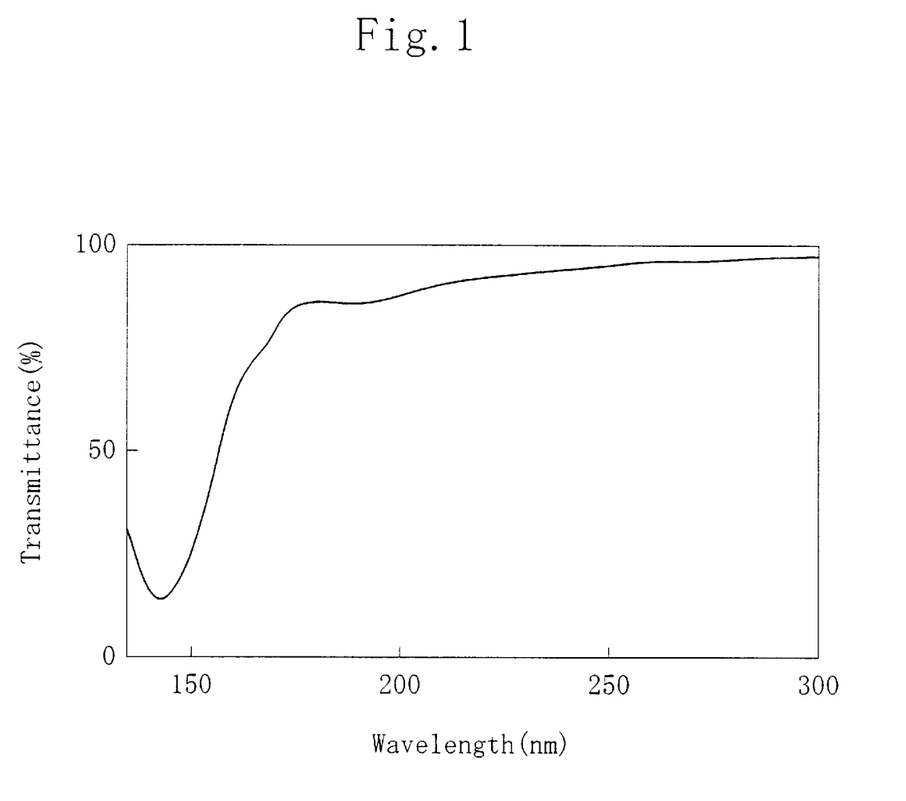
FIG. 1 is a diagram for showing the result of an experiment conducted for evaluating the invention.

FIG. 1 shows the relationship between the wavelength and the transmittance of light obtained by irradiating a polymer film with a thickness of 0.1 μm with light of a wavelength of 300 nm or less. As is understood from FIG.

1, it is confirmed that a polymer film made from poly(vinylsulfonyl fluoride) has transmittance of approximately 60% against light of a wavelength of a 157 nm band.

The present invention was devised on the basis of the findings, and specifically, the first pattern formation of this invention comprises the steps of forming a resist film by applying, on a substrate, a resist material including a base polymer having a sulfonyl group on a main chain; conducting pattern exposure by irradiating the resist film with exposing light of a wavelength of a 1 nm through 180 nm band; and developing the resist film with a developer after the pattern exposure.

In the first pattern formation method, since the base polymer of the resist material has a sulfonyl group on the main chain, the absorbing property of the resist film against light of a wavelength of a 1 nm through 180 nm band is decreased. Therefore, the transmittance of the exposing light of a wavelength of a 1 nm through 180 nm band in the resist film is increased, and hence, the exposing light can sufficiently reach the bottom of the resist film. As a result, a resist pattern can be formed in a good pattern shape.

In the first pattern formation method, the base polymer is preferably represented by any of the following General Formulas 1 through 5:

General Formula 1:

General Formula 2:

General Formula 3:

General Formula 4:

General Formula 5:

wherein R indicates a hydrogen atom, a hydroxyl group, an alkyl group, a carboxyl group, a carbonic ester, acetal, a group having a cyclic aliphatic, a group having an aromatic ring or a group having a hetero ring; and $R_1$ and $R_2$ are the same or different and selected from the group consisting of a hydrogen atom and an alkyl group.

In this manner, the resistance against dry etching can be improved because the base polymer includes an aromatic group or a cyclic aliphatic.

The first pattern formation method preferably further comprises, between the step of conducting pattern exposure and the step of forming a resist film, a step of conducting a heat treatment on the resist film.

In this manner, decomposition of the base polymer in an exposed portion of the resist film is accelerated owing to a catalytic reaction of sulfonic acid generated from the base polymer through decomposition by the exposing light.

In this case, solubility of the base polymer in the developer preferably changes in the presence of an acid, and the resist material preferably further includes an acid generator for generating an acid through irradiation with light.

In this manner, since sulfonic acid generated from the base polymer through decomposition by the exposing light and the acid generated from the acid generator are heated, the catalytic reaction of the acids is accelerated. As a result, the decomposition of the base polymer in the exposed portion of the resist film is further accelerated.

The second pattern formation method of this invention comprises the steps of forming a resist film by applying, on a substrate, a resist material including an alkali-soluble base polymer and an agent for inhibiting dissolution of the base polymer that is made from a polymer having a sulfonyl group on a main chain and decomposes through irradiation with light; conducting pattern exposure by irradiating the resist film with exposing light of a wavelength of a 1 nm through 180 nm band; and forming a resist pattern by developing the resist film with a developer after the pattern exposure.

In the second pattern formation method, since the resist material includes the agent for inhibiting dissolution of the base polymer made from the polymer having a sulfonyl group on the main chain, the absorbing property of the resist film against light of a wavelength of a 1 nm through 180 nm band is increased. Therefore, the transmittance of the exposing light of a wavelength of a 1 nm through 180 nm band in the resist film is increased, and hence, the exposing light can sufficiently reach the bottom of the resist film. As a result, a resist pattern can be formed in a good pattern shape.

In the second pattern formation method, the base polymer is preferably an acrylic type resin, a styrene type resin, a novolak resin or a polyolefin type resin.

In this manner, the resist film can be definitely changed to alkali-refractory due to the function of the agent for inhibiting dissolution of the base polymer.

In the second pattern formation method, the agent for inhibiting dissolution of the base polymer is preferably represented by any of the following General Formulas 1 through 5:

General Formula 1:

General Formula 2:

General Formula 3:

General Formula 4:

General Formula 5:

wherein R indicates a hydrogen atom, a hydroxyl group, an alkyl group, a carboxyl group, a carbonic ester, acetal, a group having a cyclic aliphatic, a group having an aromatic ring or a group having a hetero ring; and $R_1$ and $R_2$ are the same or different and selected from the group consisting of a hydrogen atom and an alkyl group.

In this manner, the resistance against dry etching can be improved because the agent for inhibiting dissolution of the base polymer includes an aromatic ring or a cyclic aliphatic.

The second pattern formation method preferably further comprises, between the step of conducting pattern exposure and the step of forming a resist film, a step of conducting a heat treatment on the resist film.

In this manner the decomposition of the agent for inhibiting dissolution of the base polymer in an exposed portion of the resist film can be accelerated due to a catalytic reaction of sulfonic acid generated from the agent for inhibiting dissolution of the base polymer through decomposition by the exposing light.

When the second pattern formation method comprises the step of conducting a heat treatment, the agent for inhibiting dissolution of the base polymer preferably decomposes in the presence of an acid, and the resist material preferably further includes an acid generator for generating an acid through irradiation with light.

In this manner, since sulfonic acid generated from the agent for inhibiting dissolution of the base polymer through decomposition by the exposing light and the acid generated from the acid generator are heated, the catalytic reaction of the acids is accelerated. As a result, the decomposition of the agent for inhibiting dissolution of the base polymer in the exposed portion of the resist film is further accelerated.

In the first or second pattern formation method, the exposing light is preferably a $F_2$ laser beam or an $Ar_2$ laser beam.

DETAILED DESCRIPTION OF THE INVENTION

Embodiment 1

A pattern formation method of Embodiment 1 will now be described with reference to FIGS. 2(a) through 2(c).

In the pattern formation method of Embodiment 1, a polymer represented by the above-described General Formula 2 is used as a base polymer of a resist material. The specific composition of the resist material is as follows:

| Base polymer: poly(novolak sulfone) (represented by Chemical Formula 6) | 2 g |
| Solvent: diglyme | 20 g |

Figure 2A:
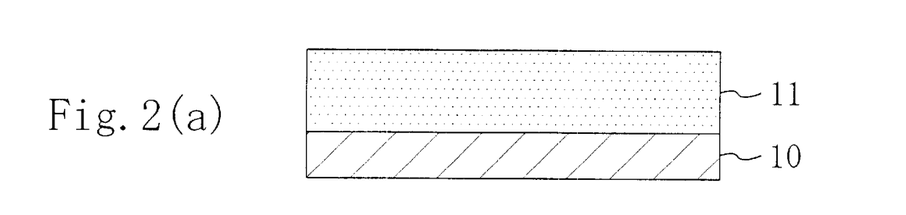
FIGS. 2(a) through 2(c) are sectional views for showing procedures in a pattern formation method of Embodiment 1 or 3 of the invention.

General Formula 6:

First, as is shown in FIG. 2(a), the resist material having the aforementioned composition is applied by spin coating on a semiconductor substrate 10, thereby forming a resist film 11 with a thickness of 0.3 µm. At this point, since the base polymer is alkali-refractory, the resist film 11 is alkali-refractory.

Figure 2B:
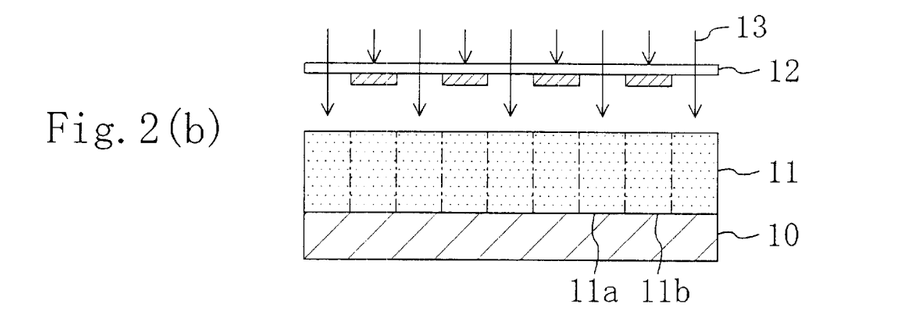
Figure 2C:
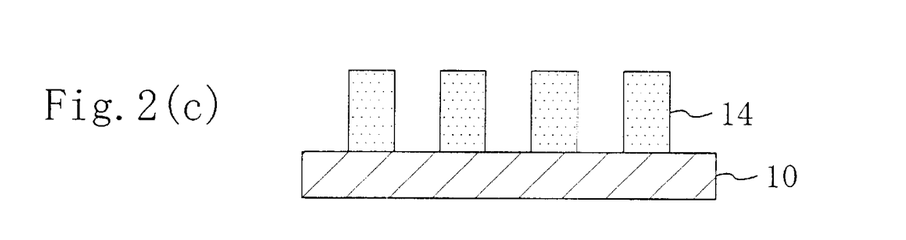

Next, as is shown in FIG. 2(b), the resist film 11 is irradiated with a $F_2$ excimer laser beam 13 (with a wavelength of a 157 nm band) through a mask 12 for pattern exposure. In this manner, the base polymer is decomposed due to the exposing light so as to generate sulfonic acid in an exposed portion 11a of the resist film 11, and hence, the exposed portion 11a of the resist film 11 becomes alkali-soluble while an unexposed portion 11b of the resist film 11 remains alkali-refractory.

Then, the resist film 11 is developed with an alkaline developer, such as a tetramethylammonium hydroxide aqueous solution. Since the exposed portion 11a of the resist film 11 is dissolved in the developer, the unexposed portion 11b of the resist film 11 is formed into a resist pattern 14 as is shown in FIG. 2(c). Thus, a positive resist pattern is formed in Embodiment 1.

In Embodiment 1, since the resist material includes the base polymer having a sulfonyl group on the main chain, the absorbing property of the resist film 11 against light of a wavelength of a 1 nm through 180 nm band is decreased. Therefore, the transmittance of the exposing light of a wavelength of a 1 nm through 180 nm band in the resist film 11 is increased, and hence, the exposing light can sufficiently reach the bottom of the resist film 11. As a result, the resist pattern 14 can be formed in a good pattern shape with a fine line width of 0.08 µm.

Figure 3:
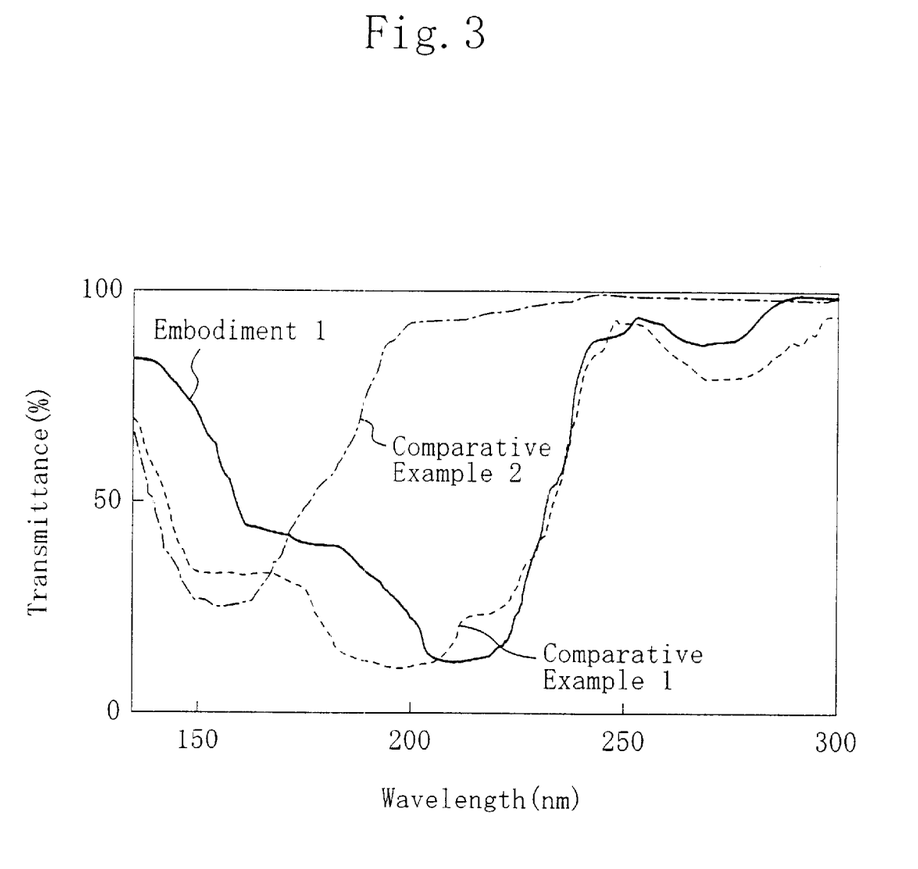
FIG. 3 is a diagram for showing the result of an experiment conducted for evaluating the pattern formation method of Embodiment 1.

FIG. 3 is a diagram for showing the result of an experiment conducted for evaluating Embodiment 1, in which the relationship between the wavelength and the transmittance of light obtained by irradiating a polymer film with a thickness of 0.1 µm with light of a wavelength of 300 nm or less is shown. In FIG. 3, the relationship obtained from a polymer film of poly(novolak sulfone) is shown as Embodiment 1; that obtained from a polymer film of the polyhydroxystyrene derivative is shown as Comparative Example 1; and that obtained from a polymer film of the polyacrylic acid derivative is shown as Comparative Example 2. As is understood from FIG. 3, the polymer film of Embodiment 1 has much higher transmittance against the $F_2$ laser beam with a wavelength of a 157 nm band than those of Comparative Examples 1 and 2.

Furthermore, the base polymer of Embodiment 1 includes an aromatic ring, and hence, the resistance against dry etching can be improved.

Although the development is conducted after the pattern exposure of the resist film 11 without conducting a heat treatment in Embodiment 1, the resist film 11 can be heated with a hot plate or the like before the development and after the pattern exposure. In this case, since sulfonic acid generated from the base polymer through decomposition by the exposing light is heated, a catalytic reaction of the acid is caused, so as to accelerate the decomposition of the base polymer in the exposed portion 11a of the resist film 11. Accordingly, the sensitivity of the resist film 11 is improved.

Embodiment 2

A pattern formation method of Embodiment 2 will now be described with reference to FIGS. 4(a) through 4(d).

In the pattern formation method of Embodiment 2, a polymer represented by the above-described General Formula 1 is used as a base polymer of a resist material. The specific composition of the resist material is as follows:

| Base polymer: a polymer represented by Chemical Formula 7 | 2 g |
| Acid generator: triphenylsulfonium triflate | 0.04 g |
| Solvent: diglyme | 20 g |

Figures 4A, 4B, 4C, 4D:
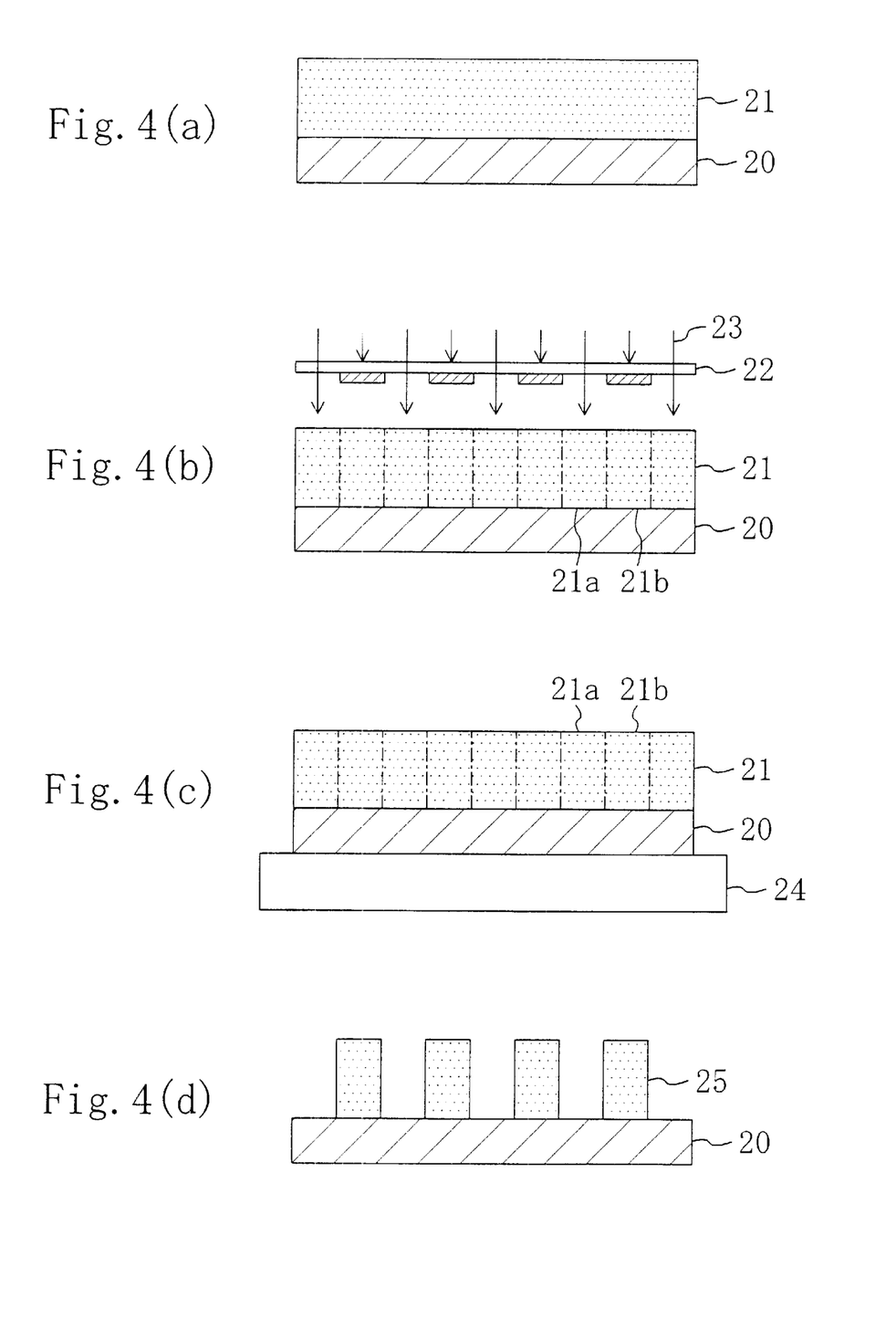
FIGS. 4(a) through 4(d) are sectional views for showing procedures in a pattern formation method of Embodiment 2 or 4.

General Formula 7:

First, as is shown in FIG. 4(a), the resist material having the aforementioned composition is applied by spin coating on a semiconductor substrate 20, thereby forming a resist film 21 with a thickness of 0.3 µm. At this point, the base polymer is alkali-refractory, and hence, the resist film 21 is alkali-refractory.

Next, as is shown in FIG. 4(b), the resist film 21 is irradiated with a $F_2$ excimer laser beam 23 (with a wavelength of a 157 nm band) through a mask 22 for pattern exposure. Thus, the base polymer is decomposed by the exposing light in an exposed portion 21a of the resist film 21 so as to generate sulfonic acid, and hence, the exposed portion 21a of the resist film 21 becomes alkali-soluble while an unexposed portion 21b of the resist film 21 remains alkali-refractory. Also, an acid is generated from the acid generator in the exposed portion 21a of the resist film 21 while no acid is generated in the unexposed portion 21b of the resist film 21.

Then, as is shown in FIG. 4(c), the semiconductor substrate 20 together with the resist film 21 are heated on a hot plate 24. Thus, sulfonic acid generated from the base polymer through decomposition by the exposing light and the acid generated from the acid generator are heated so as to cause a catalytic reaction of the acids. This catalytic reaction accelerates the decomposition of the base polymer in the exposed portion 21a of the resist film 21. Accordingly, the sensitivity of the resist film 21 is further improved.

Thereafter, the resist film 21 is developed with an alkaline developer, such as a tetramethylammonium hydroxide aqueous solution. Since the exposed portion 21a of the resist film 21 is dissolved in the developer, the unexposed portion 21b of the resist film 21 is formed into a resist pattern 25 as is shown in FIG. 4(d). Thus, a positive resist pattern is formed in Embodiment 2.

In Embodiment 2, since the resist material includes the base polymer having a sulfonyl group on the main chain, the absorbing property of the resist film 21 against light of a wavelength of a 1 nm through 180 nm band is decreased. Therefore, the transmittance of the exposing light of a wavelength of a 1 nm through 180 nm band in the resist film 21 is increased, and hence, the exposing light can sufficiently reach the bottom of the resist film 21. As a result, the resist pattern 25 can be formed in a good pattern shape with a fine line width of 0.08 μm.

Furthermore, since the base polymer of Embodiment 2 includes an aromatic ring, the resistance against dry etching can be improved.

Embodiment 3

A pattern formation method of Embodiment 3 will now be described with reference to FIGS. 2(a) through 2(c).

In the pattern formation method of Embodiment 3, a resist material includes an alkaline-soluble base polymer as well as a polymer represented by the above-described General Formula 2 as an agent for inhibiting dissolution of the base polymer (hereinafter referred to as the dissolution inhibiting agent). The specific composition of the resist material is as follows:

| | |
|---|---|
| Base polymer: novolak resin | 1.5 g |
| Dissolution inhibiting agent: | 1 g |
| a compound represented by Chemical Formula 8 | |
| Solvent: diglyme | 20 g |

General Formula 8:

First, as is shown in FIG. 2(a), the resist material having the aforementioned composition is applied by spin coating on a semiconductor substrate 10, thereby forming a resist film 11 with a thickness of 0.3 μm. At this point, although the base polymer is alkali-soluble, the resist film 11 is alkali-refractory due to the function of the dissolution inhibiting agent.

Next, as is shown in FIG. 2(b), the resist film 11 is irradiated with a $F_2$ excimer laser beam 13 (with a wavelength of a 157 nm band) through a mask 12 for pattern exposure. In this manner, the dissolution inhibiting agent is decomposed due to the exposing light so as to generate sulfonic acid in an exposed portion 11a of the resist film 11, and hence, the exposed portion 11a of the resist film 11 becomes alkali-soluble while an unexposed portion 11b of the resist film 11 remains alkali-refractory.

Then, the resist film 11 is developed with an alkaline developer, such as a tetramethylammonium hydroxide aqueous solution. Since the exposed portion 11a of the resist film 11 is dissolved in the developer, the unexposed portion 11b of the resist film 11 is formed into a resist pattern 14 as is shown in FIG. 2(c). Thus, a positive resist pattern is formed in Embodiment 3.

In Embodiment 3, since the resist material includes the dissolution inhibiting agent having a sulfonyl group on the main chain, the absorbing property of the resist film 11 against light of a wavelength of a 1 nm through 180 nm band is decreased. Therefore, the transmittance of the exposing light of a wavelength of a 1 nm through 180 nm band in the resist film 11 is increased, and hence, the exposing light can sufficiently reach the bottom of the resist film 11. As a result, the resist pattern 14 can be formed in a good pattern shape with a fine line width of 0.08 μm.

Furthermore, the dissolution inhibiting agent of Embodiment 3 includes an aromatic ring, and hence, the resistance against dry etching can be improved.

Although the development is conducted after the pattern exposure of the resist film 11 without conducting a heat treatment in Embodiment 3, the resist film 11 can be heated with a hot plate or the like before the development and after the pattern exposure. In this case, since sulfonic acid generated from the dissolution inhibiting agent through decomposition by the exposing light is heated, a catalytic reaction of the acid is caused, so as to accelerate the decomposition of the dissolution inhibiting agent in the exposed portion 11a of the resist film 11. Accordingly, the sensitivity of the resist film 11 is improved.

Embodiment 4

A pattern formation method of Embodiment 4 will now be described with reference to FIGS. 4(a) through 4(d).

In the pattern formation method of Embodiment 4, a resist material includes an alkali-soluble base polymer as well as a polymer represented by the above-described General Formula 1 as a dissolution inhibiting agent. The specific composition of the resist material is as follows:

| | |
|---|---|
| Base polymer: polyhydroxystyrene | 1.5 g |
| Dissolution inhibiting agent: | 1 g |
| a polymer represented by Chemical Formula 9 | |
| Acid generator: triphenylsulfonium triflate | 0.04 g |
| Solvent: diglyme | 20 g |

General Formula 9:

First, as is shown in FIG. 4(a), the resist material having the aforementioned composition is applied by spin coating on a semiconductor substrate 20, thereby forming a resist film 21 with a thickness of 0.3 μm. At this point, although the base polymer is alkali-soluble, the resist film 21 is alkali-refractory due to the function of the dissolution inhibiting agent.

Next, as is shown in FIG. 4(b), the resist film 21 is irradiated with a $F_2$ excimer laser beam 23 (with a wavelength of a 157 nm band) through a mask 22 for pattern exposure. Thus, the dissolution inhibiting agent is decomposed by the exposing light in an exposed portion 21a of the resist film 21 so as to generate sulfonic acid, and hence, the exposed portion 21a of the resist film 21 becomes alkali-soluble while an unexposed portion 21b of the resist film 21 remains alkali-refractory. Also, an acid is generated from the acid generator in the exposed portion 21a of the resist film 21 while no acid is generated in the unexposed portion 21b of the resist film 21.

Then, as is shown in FIG. 4(c), the semiconductor substrate 20 together with the resist film 21 are heated on a hot plate 24. Thus, sulfonic acid generated from the dissolution inhibiting agent through decomposition by the exposing light and the acid generated from the acid generator are heated so as to cause a catalytic reaction of the acids. This catalytic reaction accelerates the decomposition of the dissolution inhibiting agent in the exposed portion 21a of the resist film 21. Accordingly, the sensitivity of the resist film 21 is further improved.

Thereafter, the resist film 21 is developed with an alkaline developer, such as a tetramethylammonium hydroxide aqueous solution. Since the exposed portion 21a of the resist film 21 is dissolved in the developer, the unexposed portion 21b of the resist film 21 is formed into a resist pattern 25 as is shown in FIG. 4(d). Thus, a positive resist pattern is formed in Embodiment 4.

In Embodiment 4, since the resist material includes the dissolution inhibiting agent made from the polymer having a sulfonyl group on the main chain, the absorbing property of the resist film 21 against light of a wavelength of a 1 nm through 180 nm band is decreased. Therefore, the transmittance of the exposing light of a wavelength of a 1 nm through 180 nm band in the resist film 21 is increased, and hence, the exposing light can sufficiently reach the bottom of the resist film 21. As a result, the resist pattern 25 can be formed in a good pattern shape with a fine line width of 0.08 μm.

Furthermore, since the dissolution inhibiting agent of Embodiment 4 includes an aromatic ring, the resistance against dry etching can be improved.

In Embodiment 1 or 2, any one of the polymers represented by General Formulas 1 through 5 above can be used as the base polymer, but the base polymer is not limited to them.

In Embodiment 3 or 4, any one of the polymers represented by General Formulas 1 through 5 above can be used as the dissolution inhibiting agent, but the dissolution inhibiting agent is not limited to them.

In Embodiment 3 or 4, the alkali-soluble base polymer can be an acrylic type resin, a styrene type resin, a novolak resin or a polyolefin type resin, but the alkali-soluble base polymer is not limited to them.

In Embodiment 2 or 4, any of onium salts such as sulfonium salt and iodonium salt, sulfonic esters, diazodisulfonylmethanes and ketosulfone compounds can be appropriately used as the acid generator.

In each of Embodiments 1 through 4, any of a Xe$_2$ laser beam (with a wavelength of a 172 nm band), a F$_2$ laser beam (with a wavelength of a 157 nm band), a Kr$_2$ laser beam (with a wavelength of a 146 nm band), an ArKr laser beam (with a wavelength of a 134 nm band), an Ar$_2$ laser beam (with a wavelength of a 126 nm band) and a soft X-ray beam (with a wavelength of a 13, 11 or 5 nm band) can be used as the exposing light.

Furthermore, although a positive resist pattern is formed by removing the exposed portion of the resist film with the alkaline developer in each of Embodiments 1 through 4, a negative resist pattern can be formed instead by removing the unexposed portion of the resist film with a developer of an organic solvent.

What is claimed is:

1. A pattern formation method comprising the steps of:

forming a resist film by applying, on a substrate, a resist material including a base polymer having a sulfonyl group on a main chain wherein said base polymer is represented by any of the following General Formulas 1 through 5; wherein R indicates a hydrogen atom, a hydroxyl group, an alkyl group, a carboxyl group, a carbonic ester, acetal, a group having a cyclic aliphatic, a group having an aromatic ring or a group having a hetero ring; and R1 and R2 are the same or different and selected from the group consisting of a hydrogen atom and an alkyl group;

(1)

(2)

(3)

(4)

(5)

conducting pattern exposure by irradiating said resist film with exposing light, wherein the exposing light is selected from the group consisting of Xe$_2$ laser beam, F$_2$ laser beam, Kr$_2$ laser beam, ArKr laser beam and Ar$_2$ laser beam; and forming a resist pattern by developing said resist film with a developer after the pattern exposure.

2. The pattern formation method of claim 1, further comprising, between the step of conducting pattern exposure and the step of forming a resist film, a step of conducting a heat treatment on said resist film.

3. The pattern formation method of claim 2, wherein solubility of said base polymer in said developer changes in the presence of an acid, and said resist material further includes an acid generator for generating an acid through irradiation with light.

4. A pattern formation method comprising the steps of:

forming a resist film by applying, on a substrate, a resist material including an alkali-soluble base polymer and an agent for inhibiting dissolution of said base polymer that is made from a polymer having a sulfonyl group on a main chain and decomposes through irradiation with light wherein said agent for inhibiting dissolution of said base polymer is represented by any of the following General Formulas 1 through 5; wherein R indicates a hydrogen atom, a hydroxyl group, an alkyl group, a carboxyl group, a carbonic ester, acetal, a group having a cyclic aliphatic, a group having an aromatic ring or a group having a hetero ring; and R1 and R2 are the same or different and selected from the group consisting of a hydrogen atom and an alkyl group;

(1)

(2)

(3)

(4)

(5)

conducting pattern exposure by irradiating said resist film with exposing light, wherein the exposing light is selected from the group consisting of $Xe_2$ laser beam, $F_2$ laser beam, $Kr_2$ laser beam, ArKr laser beam and $Ar_2$ laser beam; and forming a resist pattern by developing said resist film with a developer after the pattern exposure.

5. The pattern formation method of claim 4, wherein said base polymer is an acrylic type resin, a styrene type resin, a novolak resin or a polyolefin type resin.

6. The pattern formation method of claim 4, further comprising, between the step of conducting pattern exposure and the step of forming a resist film, a step of conducting a heat treatment on said resist film.

7. The pattern formation method of claim 6, wherein said agent for inhibiting dissolution of said base polymer decomposes in the presence of an acid, and said resist material further includes an acid generator for generating an acid through irradiation with light.

* * * * *